US008621179B2

(12) United States Patent
Werner et al.

(10) Patent No.: US 8,621,179 B2
(45) Date of Patent: Dec. 31, 2013

(54) METHOD AND SYSTEM FOR PARTIAL EVALUATION OF VIRTUAL ADDRESS TRANSLATIONS IN A SIMULATOR

(75) Inventors: Bengt Werner, Åkersberga (SE); Fredrik Larsson, Solna (SE)

(73) Assignee: Intel Corporation, Santa Clara, CA (US)

( * ) Notice: Subject to any disclaimer, the term of this patent is extended or adjusted under 35 U.S.C. 154(b) by 150 days.

(21) Appl. No.: 10/710,098

(22) Filed: Jun. 18, 2004

(65) Prior Publication Data

US 2005/0283351 A1  Dec. 22, 2005

Related U.S. Application Data

(60) Provisional application No. 60/320,283, filed on Jun. 18, 2003.

(51) Int. Cl.
*G06F 12/10* (2006.01)

(52) U.S. Cl.
USPC ............ 711/203; 711/202; 711/204; 711/205

(58) Field of Classification Search
USPC ......... 711/203, 207, 200, 202, 205, 206, 204; 712/236, 205; 703/22
See application file for complete search history.

(56) References Cited

U.S. PATENT DOCUMENTS

| 4,347,565 | A | * | 8/1982 | Kaneda et al. ..................... 711/6 |
| 5,428,757 | A | * | 6/1995 | Sutton ........................... 718/107 |
| 6,009,514 | A | * | 12/1999 | Henzinger et al. ............ 712/236 |
| RE37,305 | E | * | 7/2001 | Chang et al. ................... 711/207 |
| 6,345,351 | B1 | * | 2/2002 | Holmberg ...................... 711/203 |
| 6,678,815 | B1 | * | 1/2004 | Mathews et al. ............... 711/205 |
| 7,076,635 | B1 | * | 7/2006 | Butler et al. ................... 711/213 |
| 7,143,399 | B2 | * | 11/2006 | Civlin ........................... 717/140 |
| 7,406,613 | B2 | * | 7/2008 | Dieffenderfer et al. ........ 713/320 |
| 2003/0125924 | A1 | * | 7/2003 | Lines et al. ..................... 703/20 |
| 2004/0010675 | A1 | * | 1/2004 | Moritz ........................... 711/202 |
| 2004/0064668 | A1 | * | 4/2004 | Kjos et al. ..................... 711/202 |
| 2004/0068618 | A1 | * | 4/2004 | Hooker .......................... 711/141 |
| 2005/0114850 | A1 | * | 5/2005 | Chheda et al. ................. 717/151 |
| 2007/0005933 | A1 | * | 1/2007 | Kopec et al. ................... 711/207 |

OTHER PUBLICATIONS

P.S. Magnusson and B. Werner. Efficient Memory Simulation in SImICS. In proceedings of the 28th Annual Simulation Symposium, 1995.*

Goldberg, Robert P. A survey of Virtual Machine Research. Jun. 1974. Computer. vol. 7. No. 6. pp. 34-45.*

* cited by examiner

*Primary Examiner* — Sanjiv Shah
*Assistant Examiner* — Samuel Dillon
(74) *Attorney, Agent, or Firm* — Trop, Pruner & Hu, P.C.

(57) ABSTRACT

A method and system for simulating in software a digital computer system by performing virtual to physical translations of simulated instructions is disclosed. The number of virtual to physical translations using hash lookups is reduced by analyzing sequences of the instructions for determining with high probability whether the memory accesses made by the instructions perform the same virtual to physical translation in order to reduce the number of necessary hash lookups to enable faster simulation performance.

23 Claims, 2 Drawing Sheets

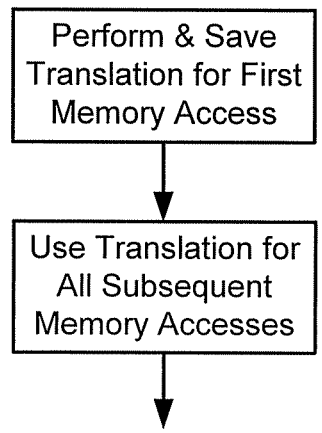
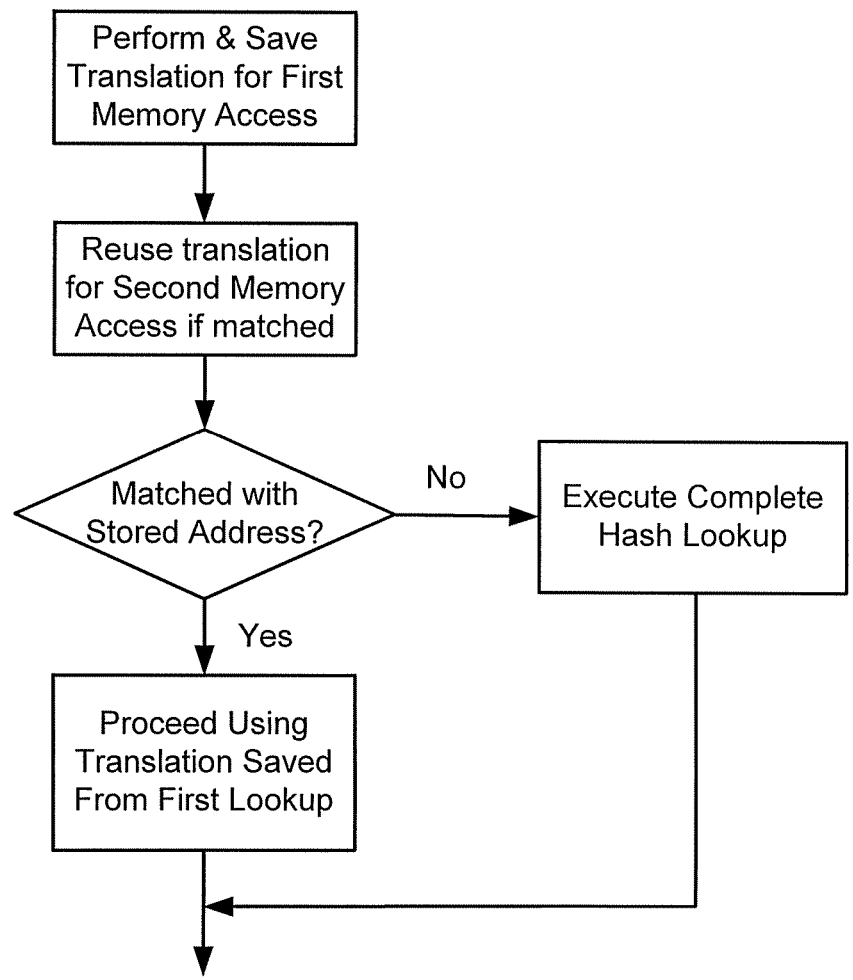

METHOD AND SYSTEM FOR PARTIAL EVALUATION OF VIRTUAL ADDRESS TRANSLATIONS IN A SIMULATOR

CROSS REFERENCE TO RELATED APPLICATIONS

This application claims the benefit of a U.S. Provisional Application No. 60/320,283 filed on Jun. 18, 2003.

BACKGROUND OF INVENTION

Field of the Invention

The present invention relates generally to software based computer system simulators and, more particularly, to enabling faster simulation performance by analyzing the past behavior of simulated instructions to determine when it is necessary to execute code that is more costly in terms of performance.

The use of simulation systems for developing computer systems and software has shown to provide tremendous advantages in terms of timesavings and cost. More recently, the technique of full system simulation has gained more attention as advances in processor speeds of contemporary host computer platforms enable good simulation of detailed hardware models in computer system architectures. System simulation provides a virtual computer with the capability to create functional models of CPUs with supporting chips in sufficient detail to execute native object code without modification. Furthermore, simulation provides the significant advantage of enabling developers to develop and test their software applications and hardware products on high-end systems without having to use actual hardware with its associated expense or unavailable hardware still under development.

Simulation offers benefits for software development where it can arbitrarily parameterize, control, and inspect the computer system it is modeling and provide measurements that are non-intrusive and deterministic. It also provides a basis for automation where multiple simulator sessions can run in parallel and sessions can be fully scripted using performance monitors. For example, the software can be combined with the virtual systems in a way that facilitates modeling of the processor, disk access, memory access, cache configuration, and memory system bus and other parameters. With full system simulation, the operating system, device drivers, and application software cannot tell whether they are running on real hardware or in the simulated environment. Maximum flexibility is obtained using the simulated environment with the ability to change the parameters to suit a particular testing environment while performing comprehensive data collection and execution and performance tracking.

A critical issue relating to simulation systems is that of performance i.e. a tradeoff must typically be made between the accuracy of simulating the system as closely as possible versus a performance level that is acceptable. Creating a more realistic simulation workload environment generally comes at the expense of time and cost to deal with specification inaccuracies and implementation errors. One area that has a significant affect on performance relates to memory accesses. Memory accesses are operations that are typically performed very frequently thus any improvement in access times can significantly improve simulation performance. By way of example, when simulating an instruction set of a modern processor, simulation of memory accesses is a key component of the simulator efficiency, since memory accesses are generally very frequent operations that e.g. can consist of somewhere between one fifth to one third of all operations. The simulated processor has a memory management unit (MMU) which checks that the addresses may be accessed and translates the virtual memory addresses to physical memory addresses. For every memory access, this check and translation is performed, which when normally done in hardware has an insignificant affect on performance but greatly affects the simulation performance.

Modern processors often employ virtual memory page based translation. In some cases, other mechanisms such as segmentation are used in addition to paging. A page is a fixed size, aligned address range with a specific translation from virtual to physical address. The page is also used to specify the access rights i.e. if the addresses can be read, written or executed. Thus a page is the smallest address range which can have a specified virtual to physical address translation and can have a specified access protection. Some architectures allow so-called large pages, i.e. pages of different sizes where the larger page size is an even multiple of the smaller page sizes.

Conventional simulators have either used the hardware support from the host or a pure software algorithm to perform the virtual to physical address translation. When doing it in software, a hash lookup is typically performed first. The hash lookup typically requires many simulated instructions thereby affecting performance if done too frequently. If the lookup hits, which is the common fast case, the access is guaranteed not to violate any access restrictions and the lookup table returns the address where simulated memory is stored. If the lookup misses, a slow path is used that can handle all the uncommon cases that can happen to a memory access, such as a TLB miss, access violation, and miss alignment. A description of such a lookup algorithm can be found in REF1 i.e. the article "Efficient Memory Simulation in SimICS" by P. S. Magnusson and B. Werner, in Proceedings of the 28th Annual Simulation Symposium, 1995, However, even if the lookup hits it is costly in terms of performance cost to perform it for every memory access.

A simulator running as a user process on a conventional OS cannot use hardware support to perform translations. To this the process must be given OS privileges or the OS must be modified to allow the simulator more control of the host hardware. Typically, the simulator wants to control the host translation look-aside buffer (TLB) and/or the segmentation hardware to support the simulated translations.

In view of the foregoing, it is desirable to provide a commercial quality level simulation platform that offers improved simulator performance in order to more accurately model workloads by running unmodified code in realistic configurations.

SUMMARY OF INVENTION

Briefly described and in accordance with embodiments and related features of the invention, there is provided a method and system for simulating in software a digital computer system by performing virtual to physical translations of simulated instructions is disclosed. The number of virtual to physical translations using hash lookups is reduced by analyzing sequences of the instructions for determining with high probability whether the memory accesses made by the instructions perform the same virtual to physical translation in order to reduce the number of necessary hash lookups to enable faster simulation performance.

In accordance with an embodiment of the invention, several memory accesses within a super block are known to access the same address thus a translation is performed for the first memory access and the following memory accesses use the same translation.

In accordance with another embodiment, several memory accesses within a super block access the same page with high probability therefore a translation is performed for the first memory access and the following accesses do not need to perform the hash lookup but instead is checked to verify that the lookup matched with the translation of the first memory access, if there is a match the access can proceed using the translated address saved from the first lookup, otherwise a complete hash lookup is performed.

In accordance with still another embodiment, one or more memory accesses within a loop are known to access only within the same page for some number of iterations of the loop. The instructions within the loop are analyzed such that, for each memory access, the number of iterations performed in the loop without accessing another page is calculated such that the virtual to physical translation is performed, the calculated number of iterations is run using the translated address in the loop.

In accordance with still another embodiment, for a memory access that is executed multiple times, the translation is performed the first time the memory access is performed and saved in a table or cached in memory such that subsequent memory accesses can attempt to match the lookup.

In accordance with another aspect of the invention, a computer program product capable of being run on a host system for simulating in software a physical digital computer system, comprising a computer readable storage medium having a computer readable program code means embedded in said medium. The computer readable program code means comprises computer instruction means for performing virtual to physical translations of simulated instructions whereby faster simulation performance is obtained by reducing the number of necessary virtual to physical translations using hash lookups for the simulated instructions.

BRIEF DESCRIPTION OF DRAWINGS

The invention, together with further objectives and advantages thereof, may best be understood by reference to the following description taken in conjunction with the accompanying drawings in which:

FIG. 1 illustrates steps relating to case i) in accordance with an embodiment of the invention;

FIG. 2 illustrates steps relating to case ii) in accordance with an embodiment of the invention;

DETAILED DESCRIPTION

Figure 3:
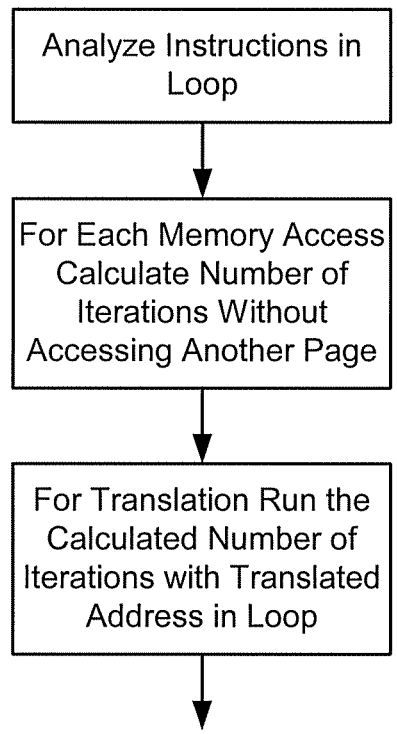
FIG. 3 illustrates steps relating to case iii) in accordance with an embodiment of the invention.

In accordance with an embodiment of the invention, simulation performance is improved by reducing the number of virtual to physical translations and to reduce the cost of the remaining translations without the need for OS privileged hardware support. In other words, the number of simulated hardware checks with memory accesses is reduced by skipping the check if a previous access to the same page in memory was performed earlier. Furthermore, the hash lookup will be used fewer times and some of the remaining hash lookups can be simplified, thereby resulting in a faster simulator. In accordance with the embodiment, the invention operates by analyzing sequences of instructions and utilizing two common properties of the memory accesses made by the instructions. The first property is that given a sequence of executed instructions, accesses made from different memory access instructions often perform the same virtual to physical translation. The second property is that if the same instruction is executed multiple times it often performs a memory access to the same page. These properties are related to spatial and temporal locality but in this case it is desirable to have locality between accesses made from a particular sequence of instructions.

An analysis to check for valid memory accesses is made when the instructions are being simulated. A mechanism must be applied to make sure a performance costly analysis is not performed on all lines of executed code, but only the frequently executed parts. Statistics, on the other hand, have a low overhead and can be collected on all executed code. This is generally done by incrementing a counter each time a code jump is performed. In accordance with the embodiment, an analysis is only applied when a counter reaches a particular threshold value thereby regulating the number of analyses performed. The analysis check is typically performed for memory accesses that use the same translation or for accesses that have a high probability of using the same translation.

The following definitions are used herein in describing the invention.

A BASIC BLOCK is sequence of instructions that are always executed in sequence, i.e. there are only jumps to the first instruction and from the last instruction in the basic block.

A SUPER BLOCK is a sequence of instructions with only one entry point, but multiple exit points, i.e there are only jumps to the first instruction in the block, but the may be conditional jumps out of the block from any instruction in the block.

The fact that sequences of memory accesses often do the same virtual to physical translation is used in several ways:
i) Several memory accesses within a super block are known to access the same address.
ii) Several memory accesses within a super block access the same page with a high probability.
iii) One or more memory accesses within a loop are known to access only within the same page for some number of iterations of the loop.
iv) A memory access which is executed multiple times has a high probability of accessing the same page.

FIG. 1 illustrates steps relating to case i) in accordance with an embodiment of the invention. In case i) the translation need only be done once, for the first memory access. The following memory accesses can use the same translation.

FIG. 2 illustrates steps relating to case ii) in accordance with an embodiment of the invention. In case ii) the translation is done for the first memory access. The following accesses need not do the hash lookup to find the entry to compare to. They just have to do the match to check that the lookup matched. If there is a match the access can proceed using the translation saved from the first lookup. In the unlikely event of a mismatch the complete hash lookup is done.

FIG. 3 illustrates steps relating to case iii) in accordance with an embodiment of the invention. In case iii) the instructions within the loop need to be analyzed. For each memory access you calculate the minimum number of iterations you can do in the loop without accessing another page. Then you do the virtual to physical translation, run that number of iterations using the translated address in the loop.

Figure 4:
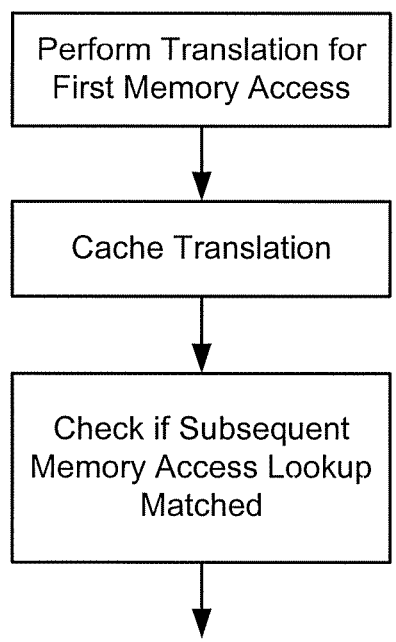
FIG. 4 illustrates steps relating to case iv) in accordance with an embodiment of the invention.

FIG. 4 illustrates steps relating to case iv) in accordance with an embodiment of the invention. In case iv) the translation is done the first time the memory access is executed. The translation is cached so that subsequent memory accesses can try to match the lookup.

In another embodiment of the invention, a correlation can be determined for several instructions and used advantageously to predict whether a later instruction will accesses the same page. By way of example, a later executed instruction can be assumed to reside on the same page as a previous correlated instruction, which allows for further elimination of simulated accesses and optimization of the simulation software. The correlations can be derived from OLE_LINK1 heuristic algorithms OLE_LINK1 based past executions of instructions.

The techniques can be generalized and be applied also to sequences of super blocks, nested loops and other control flow structures to decrease the number of virtual translations further.

The code that makes the hash lookup for the load and the store instructions follows. Names starting with a lower case r are all registers that should be mapped to real registers. Here we use the more descriptive names for clarity. Words with only upper case letters are constants that are actually numbers. Again we use more descriptive names. rData is a register that points to a data section in the simulator program from where we can get the address of the hash table. The register rAddr holds the virtual address that we want to lookup.

The hash lookup code comprises, in the example below, of a relatively lengthy of nine lines of code. Note that this code differs slightly from the hash table lookup code described in REF1 because that code was aimed at simulating a SPARC V8 architecture whereas this sample code is indented to simulate a SPARC V9 architecture. For instance the ldd instruction cannot be used to load two 64 bits values from memory to two consecutive registers.

| Instruction | Comments |
| --- | --- |
| ldx rHashBase, [rData + HASH_TABLE] | ;Get the address of the hash table. |
| srlx rAddr, HASH_PAGE_SHIFT, rIndex | ;Calculate an index (or offset) to the tag in the |
| and rIndex, HASH_INDEX_MASK, rIndex | ;hash table for the address. |
| ldx [rHashBase + rIndex], rTag | ;Load the tag. |
| add rIndex, TAG_SIZE, rIndex | ;The magic offset is stored TAG_SIZE bytes after |
| ldx [rHashBase + rIndex], rOffset | ;the tag in the hash table. Load the magic offset. |
| andn rAddr, HASH_CHECK_MASK, rPageAddr | ;Check that the tag corresponds |
| cmp rPageAddr, rTag | ;to the address. |
| add rAddr, rOffset, rRealAddress; | ;Calculate the real address (simulated physical address) to do the actual load/store from/to |
| bne hash_miss | ;If not a match we jump to code for a real MMU lookup. |

The following examples are shown using the SPARC V9 instructions set architecture described in SPARC V9 architecture manual.

By way of example, there is shown a simulation of the following instructions which increment a value in memory:

| Instruction | Comments |
| --- | --- |
| 1. ldx [%g1], %g2 | ;load register g2 with a value from address pointed to by register g1 |
| 2. add %g2, 1, %g2 | ;add 1 to register g2 |
| 3. stx %g2, [%g1] | ;store back the incremented value to the same address in memory |

The pseudo code that is needed to simulate the three instructions above would look something like:

1a. Code to simulate the read of the value in register g1 (which is the address we will load from).
1b. Code to do the hash lookup (see below).
1c. Code which uses the pointer supplied by the hash lookup to load the value 1d. Code to simulate the write to register g2.
2a. Code to simulate the read of the value in register g2.
2b. Code to add 1 to the value.
2c. Code to simulate the write of the new value to register g2.
3a. Code to simulate the read of the value in register g1 (which is the address we will store to).
3b. Code to do the hash lookup (see below).
3c. Code to simulate the read of the value in register g2.
3d. Code which uses the pointer supplied by the hash lookup to store the value.

It should be noted that the from/to addition could be performed as part of the address generation in a SPARC load/store instruction that does the actual load to/store from simulated memory. The addition has been added in the description for exemplary purposes and improved clarity.

The invention in case (i) is to analyze the instructions and detect that the register g1 in this case will never change between the load and the store. In this case we know that the code will access the same page and we can thus reuse the rRealAddress pointer for the second memory access. In more general terms, the invention is to use code that analyzes a block of instructions and figures out which instructions uses (accesses) the same page. Simulation code can than be created that only makes a full lookup for the first time a page is accesses within the block. A block may be arbitrary big.

The invention in case (ii) is to analyze a block of instructions and detect memory accesses that with a high degree of probability will access the same page, as shown in the following example:

| Instruction | Comments |
| --- | --- |
| 1. ldx [%g1 + 16], %g2 | ;load register g2 with a value from address g1 + 16. |
| 2. add %g2, 1, %g2 | ;add 1 to register g2 |
| 3. stx %g2, [%g1 + 24] | ;store back the incremented value to address g1 + 24. |

It is very likely that the address g1+16 and g1+24 will access the same page but this cannot be known with certainty since a page boundary could be located on address g1+24, for example. In this case we use code for the second memory access that looks like this:

| Instruction | Comments |
|---|---|
| and rAddr, HASH_CHECK_MASK, rPageAddr | ;Check that the tag corresponds |
| cmp rPageAddr, rTag | ;to the address. |
| add rAddr, rOffset, rRealAddress | ;Calculate the real address (simulated physical address); to do the actual load/store from/to |
| bne hash_miss | ;If not a match we jump to code for a full hash lookup (the addresses was on different pages). |

In this example, both the rTag and the rOffset are saved from the first hash lookup in the block. rAddr is the address that cannot be trusted completely to access the same page.

FIG. 2 shows an exemplary flow diagram of an algorithm of case (ii) for checking whether the virtual address is accessible i.e. whether it is necessary to get a translation to the physical address for the virtual address. In the first step, a hash lookup is performed in a table for the first memory access to determine whether the virtual address is present. If there is a match i.e. address is in the table, then access to the address is permitted to the page in memory and can be performed. The translation is then saved for the second access that can be reused with a high level of probability. This is confirmed with a check that has a lower performance cost of three lines thus saving the execution of six lines of code. Thus the relatively long hash lookup of nine instructions is forgone at this point.

The analyzer code for case (ii) can also use a statistical measure such as heuristics to find memory accesses that goes to the same page. For instance if e.g. the last 100 (or a more tuned number) accesses of two memory instructions uses the same page it is very likely that they will do so in the future as well.

The invention in case (iii) is to use code that analyzes a loop and figures out which accesses in the loop that goes to the same page or are likely to go to the same page. Then either the lookup code in case (i) or in case (ii) can be used. If the loop instead is unrolled then case (i) or (ii) can be used directly on the resulting code.

The invention in case (iv) is to use temporal locality instead of spatial locality as in case i, ii, and iii. The observation here is that some instructions will often access the same page every time they are executed. For instance when global variables are accessed. Here the analyzer code can use statistical measurements as in case (ii) to identify suitable instructions. The first time such instruction is executed it performs a full hash lookup but saves the values of the tag and offset for future invocations which uses the minimal lookup as in case (ii). This case has the advantage of not depending on an earlier instruction in the block that saves the tag/offset pair. It has its own copy. This case can also be used in combination with case (iii).

The foregoing description of the preferred embodiment of the invention has been presented for purposes of illustration and description. It is not intended to be exhaustive or to limit the invention to the precise forms disclosed, since many modifications or variations thereof are possible in light of the above teaching. Accordingly, it is to be understood that such modifications and variations are believed to fall within the scope of the invention. It is therefore the intention that the following claims not be given a restrictive interpretation but should be viewed to encompass variations and modifications that are derived from the inventive subject matter disclosed.

The invention claimed is:

1. A method of simulating memory accesses comprising:
simulating memory accesses with a software simulation system for simulating a computer system operating as an application on top of a host operating system, wherein the host operating system resides between the software simulation system and host hardware and moderates transactions between the software simulation system and the host hardware, wherein simulating memory accesses with the software simulation system includes:
analyzing a sequence of simulated instructions of the software simulation system including a memory access made by a first simulated instruction of the sequence of simulated instructions using analyzer code;
determining with at least a high probability that is less than 100%, based on analyzing the sequence of simulated instructions, that another memory access made by another simulated instruction in the sequence of simulated instructions is to access the same memory page as the memory access made by the first simulation instruction;
after determining the another memory access is to access the same memory page, performing a virtual to physical translation to obtain a translated address for the memory access made by the first simulated instruction using a hash lookup that is implemented with a plurality of simulated instructions; and
after determining the another memory access is to access the same memory page, performing the another memory access using the translated address and no hash lookup or need for privileged operating system support.

2. The method according to claim 1, wherein, if several memory accesses within a super block are known to access the same address then a translation is performed for the first memory access and the following memory accesses use the same translation.

3. The method according to claim 1, wherein, if several memory accesses within a super block access the same page with a high probability then a translation is performed for the first memory access and saved, and the following accesses perform no hash lookup but instead check to verify that the following translation matched with the saved translation, if there is a match the following access can proceed using the translation saved from the first lookup.

4. The method according to claim 3, wherein, statistical measurements are used for identifying instructions with the high probability.

5. The method according to claim 1, wherein, if one or more memory accesses within a loop are known to access only within the same page for a number of iterations of the loop, the instructions within the loop are analyzed such that, for each memory access, the number of iterations performed in the loop without accessing another page is calculated, the virtual to physical translation is performed and the calculated number of iterations is run using the translated address.

6. The method according to claim 1, wherein, if a memory access which is executed multiple times the translation is performed the first time the memory access is executed, wherein the translation is saved in a table or cached in memory such that subsequent memory accesses can attempt to match the lookup.

7. The method according to claim 6, wherein, performing the lookup match has a lower performance cost in comparison with performing the hash lookup.

8. The method according to claim 1, further comprising determining a correlation for the sequence of simulated instructions to predict whether a later instruction will access the same page, and if so, to eliminate the later instruction to optimize the software simulation system.

9. The method according to claim 1, wherein, all internal hardware and software states monitored and tracked with each executed simulated instruction.

10. A system comprising:
a software simulation system, included in at least one memory coupled to at least one processor and configured to simulate memory accesses, that is to operate as an application on top of a host operating system that resides between the software simulation system and host hardware and moderates transactions between the software simulation system and the host hardware, the software simulation system further including:
   means for analyzing a sequence of simulated instructions of the software simulation system including a memory access made by a first simulated instruction of the sequence of simulated instructions;
   means for determining with at least a high probability that is less than 100%, based on analyzing the sequence of simulated instructions, that another memory access, unequal to the memory access, made by another simulated instruction, unequal to the first simulated instruction, in the sequence of simulated instructions is to access the same memory page, but not the exact same memory address, as the memory access made by the first simulation instruction;
   means for performing a virtual to physical translation to obtain a translated address for the memory access made by the first simulated instruction using a hash lookup that is implemented with a plurality of simulated instructions after the means for determining determines the another memory access is to access the same memory page; and
   means for performing the another memory access using the translated address and no hash lookup attempt or need for privileged operating system support after the means for determining determines the another memory access is to access the same memory page.

11. The system of claim 10, wherein the memory access for the first simulated instruction and the following memory accesses use the same translation.

12. The system of claim 10, wherein, the system comprises means to perform and save a translation for the first memory access, and for following accesses to perform no hash lookup but instead check to verify that the following translation matched with the saved translation.

13. The system of claim 12, wherein, the system comprises means for identifying instructions with the high probability.

14. The system of claim 10, wherein the system comprises means for saving the translation in a table or cached in memory such that subsequent memory accesses can attempt to match the lookup.

15. A non-transitory computer readable storage medium having instructions stored thereon that when executed enable a system to:
   simulate memory accesses with a software simulation system operating as an application on top of a host operating system, wherein the host operating system resides between the software simulation system and host hardware and moderates transactions between the software simulation system and the host hardware such that the software simulation system operates without need for privileged operating system support, wherein the instructions to simulate memory accesses are to:
   analyze a sequence of simulated instructions of the software simulation system including a memory access made by a first simulated instruction of the sequence of simulated instructions using analyzer code;
   determine with at least a high probability that is less than 100%, based on analyzing the sequence of simulated instructions, that another memory access made by another simulated instruction in the sequence of simulated instructions is to access the same memory page as the memory access made by the first simulation instruction; and
   after determining the another memory access is to access the same memory page, perform a virtual to physical translation to obtain a translated address for the memory access made by the first simulated instruction using a hash lookup that is implemented with a plurality of simulated instructions; and
   after determining the another memory access is to access the same memory page, perform the another memory access using the translated address without any hash lookup.

16. The computer readable storage medium of claim 15, wherein the instructions further enable the system to perform and save a translation for the memory access, and not perform any hash lookup for the following accesses but instead check to verify that the following translation matched with the saved translation.

17. The computer readable storage medium of claim 15, wherein the instructions further enable the system to analyze the instructions such that, for each memory access, the number of iterations performed in a loop without accessing another page is calculated, the virtual to physical translation is performed and the calculated number of iterations is run using the translated address.

18. The computer readable storage medium of claim 15, wherein the instructions further enable the system to perform the translation the first time the memory access is executed, wherein the translation is saved in a table or cached in memory such that subsequent memory accesses can attempt to match the lookup.

19. The computer readable storage medium of claim 15, further comprising instructions to determine a correlation for the sequence of simulated instructions to predict whether a later instruction will access the same page, and if so, to eliminate the later instruction to optimize the software simulation system.

20. A non-transitory computer readable storage medium with instructions that when executed enable an operating system-hosted simulator to simulate memory accesses by:
   analyzing simulated instructions including a first memory access by a first simulated instruction that is to access a memory page;
   determining with a high probability, based on analyzing the simulated instructions, a second memory access by a second simulated instruction is to access the memory page; and
   after determining the second memory access is to access the memory page, (a) performing a virtual to physical translation to obtain a translated address for the first memory access using a hash lookup; and (b) performing the second memory access using the translated address without any hash lookup;
   wherein the high probability is less than 100%.

21. The medium of claim 20 comprising instructions to save a translation for the first memory access and verify following translations match the saved translation.

22. The medium of claim 20 comprising instructions to analyze the simulated instructions such that, for each memory access, the number of iterations performed in a loop without accessing another page is calculated.

23. The medium of claim 20 comprising instructions to predict whether a later instruction will access the memory page, and if so, eliminate the later instruction.

* * * * *